United States Patent
Ohsawa et al.

(10) Patent No.: US 8,227,705 B2
(45) Date of Patent: *Jul. 24, 2012

(54) WIRED CIRCUIT BOARD AND PRODUCING METHOD THEREOF

(75) Inventors: Tetsuya Ohsawa, Osaka (JP); Yasunari Ooyabu, Osaka (JP); Jun Ishii, Osaka (JP)

(73) Assignee: Nitto Denko Corporation, Osaka (JP)

( * ) Notice: Subject to any disclaimer, the term of this patent is extended or adjusted under 35 U.S.C. 154(b) by 349 days.

This patent is subject to a terminal disclaimer.

(21) Appl. No.: 12/453,473

(22) Filed: May 12, 2009

(65) Prior Publication Data

US 2009/0283314 A1 Nov. 19, 2009

Related U.S. Application Data

(60) Provisional application No. 61/071,878, filed on May 22, 2008.

(30) Foreign Application Priority Data

May 14, 2008 (JP) ................................. 2008-127234

(51) Int. Cl.
*H05K 1/11* (2006.01)
*G11B 21/16* (2006.01)
(52) U.S. Cl. ..................................... 174/261; 360/245.9

(58) Field of Classification Search ................... 174/254, 174/261, 250; 360/244.1, 245.8, 245.9; 361/749, 361/767, 774, 776, 777; 205/123; 257/775
See application file for complete search history.

(56) References Cited

U.S. PATENT DOCUMENTS

| | | | | |
|---|---|---|---|---|
| 5,208,658 A * | 5/1993 | Murata | ......................... | 257/758 |
| 5,309,316 A * | 5/1994 | Yagi et al. | ..................... | 174/260 |
| 6,493,190 B1 * | 12/2002 | Coon | ......................... | 360/245.9 |
| 2006/0034018 A1 * | 2/2006 | Deguchi et al. | ............ | 360/245.9 |
| 2006/0223223 A1 | 10/2006 | Okazawa et al. | | |
| 2008/0134500 A1 * | 6/2008 | Ishii et al. | ........................ | 29/831 |
| 2008/0273269 A1 * | 11/2008 | Pro | ............................. | 360/234.6 |

FOREIGN PATENT DOCUMENTS

| | | |
|---|---|---|
| JP | 3-245593 | 11/1991 |
| JP | 2002-020898 | 1/2002 |
| JP | 2006-287034 | 10/2006 |

* cited by examiner

*Primary Examiner* — Timothy Thompson
*Assistant Examiner* — Roshn Varghese
(74) *Attorney, Agent, or Firm* — Jean C. Edwards, Esq.; Edwards Neils PLLC

(57) ABSTRACT

A method for producing a wired circuit board includes the steps of integrally forming a conductive pattern, a plating lead electrically connected with the conductive pattern, and a regulation portion provided in the plating lead to regulate penetration of an etchant into the conductive pattern; and etching the plating lead with the etchant while the regulation portion regulates the penetration of the etchant into the conductive pattern.

7 Claims, 11 Drawing Sheets

WIRED CIRCUIT BOARD AND PRODUCING METHOD THEREOF

CROSS-REFERENCE TO RELATED APPLICATIONS

This patent application claims the benefit of U.S. Provisional Application No. 61/071,878, filed on May 22, 2008, and claims priority from Japanese Patent Application No. 2008-127234, filed on May 14, 2008, the contents of which are herein incorporated by reference in their entirety.

BACKGROUND OF THE INVENTION

1. Field of the Invention

The present invention relates to a wired circuit board and a producing method thereof. More particularly, the present invention relates to a wired circuit board such as a suspension board with circuit, and a production method thereof.

2. Description of Related Art

In conventional production methods of wired circuit boards such as a suspension board with circuit, a gold plating layer is provided on a surface of a terminal portion of a conductive pattern. The gold plating layer is formed by electrolytic gold plating in which electric power is fed from feeding pads to the conductive pattern through plating leads.

For example, there has been proposed a method for producing a magnetic head suspension including the following steps: A conductive layer pattern and a plating lead portion (a pad portion) which is electrically connected thereto are integrally formed on a substrate and an insulating layer, and then a covering layer for covering a part of the plating lead portion and having an opening for exposing the conductive layer pattern is formed. Subsequently, electrode pads made of gold are formed on the conductive layer pattern in the opening by feeding electric power from the plating lead portion, and then after the electrode pads are covered with a resist film, the plating lead portion exposed from the covering layer is removed by etching (cf. Japanese Unexamined Patent Publication No. 2002-20898).

SUMMARY OF THE INVENTION

However, in the method for producing the magnetic head suspension described in Japanese Unexamined Patent Publication No. 2002-20898 mentioned above, when the plating lead portion is etched, the plating lead portion covered with the covering layer may be excessively etched.

That is, the etchant dissolves the plating lead portion covered with the covering layer toward the conductive layer pattern side and further reaches the conductive layer pattern under the electrode pads, thereby disadvantageously causing contamination, discoloration, or dissolution of the conductive layer pattern.

It is an object of the present invention to provide a wired circuit board capable of preventing a conductive pattern from being contaminated even though a plating lead is removed by etching, and a production method thereof.

The method for producing a wired circuit board according to the present invention includes the steps of integrally forming a conductive pattern, a plating lead electrically connected with the conductive pattern, and a regulation portion provided in the plating lead to regulate penetration of an etchant into the conductive pattern; and etching the plating lead with the etchant while the regulation portion regulates the penetration of the etchant into the conductive pattern.

According to this method, the conductive pattern and the plating lead provided with a regulation portion are integrally formed. Subsequently, the plating lead is etched with the etchant while the regulation portion regulates penetration of the etchant into the conductive pattern.

Therefore, after electrolytic plating by feeding electric power to the conductive pattern through the plating lead, the regulation portion can prevent dissolution and discoloration caused by the etchant in the conductive pattern.

The wired circuit board of the present invention includes a conductive pattern; and a plating lead electrically connected with the conductive pattern, in which the plating lead includes a regulation portion for regulating penetration of an etchant into the conductive pattern.

With this wired circuit board, when the plating lead is etched after electrolytic plating by feeding electric power to the conductive pattern through the plating lead, the regulation portion can regulate penetration of the etchant into the conductive pattern.

Therefore, the regulation portion can prevent dissolution and discoloration caused by the etchant in the conductive pattern.

In the wired circuit board of the present invention, it is preferable that the plating lead has a narrow portion having a short length in a widthwise direction orthogonal to an opposite direction to the conductive pattern, and a wide portion having a length in the widthwise length longer than the narrow portion, wherein at least the wide portion serves as the regulation portion.

In the wired circuit board, the etchant spreads along the widthwise direction over the regulation portion that includes at least wide portion, so that it is possible to delay the penetration of the etchant in the opposite direction.

Moreover, the etchant spreading along the width direction contacts a large contact area of the regulation portion that includes at least wide portion, and the contact surface is dissolved by the etchant. Therefore, the etchant that has dissolved the contact surface has lower etching ability, so that the etchant is less likely to penetrate in the opposite direction. As a result, the regulation portion can effectively prevent penetration of the etchant in the opposite direction.

In addition, residual etchant in contact with the wide portion can be easily removed by washing, so that possible contamination by the etchant can be avoided.

In the wired circuit board of the present invention, it is preferable that the plating lead has a bending portion formed so as to bend in a direction of crossing the opposite direction to the conductive pattern, wherein at least the bending portion serves as the regulation portion.

In this wired circuit board, since the regulation portion that includes at least the bending portion bends in a cross direction, the length of the regulation portion is inevitably longer than the straight line length of the regulation portion in the opposite direction. Therefore, even if an etchant penetrates into the regulation portion, the regulation portion can regulate the penetration of the etchant in the opposite direction. As a result, dissolution and discoloration caused by the etchant in the conductive pattern can be prevented effectively.

The wired circuit board of the present invention includes a conductive pattern; and a covering portion for covering a regulation portion for regulating penetration of an etchant into the conductive pattern.

With this wired circuit board, when the plating lead electrically connected with the conductive pattern is etched with the etchant, the covering portion allows the penetration of the etchant, so that the etchant contacts the regulation portion.

Therefore, the regulation portion can prevent the etchant from penetrating into the conductive pattern.

In the wired circuit board of the present invention, it is preferable that a narrow opening having a short length in a widthwise direction orthogonal to an opposite direction to the conductive pattern and a wide opening having a length in the widthwise direction longer than the narrow opening are formed, in the covering portion, wherein at least the wide opening receives the regulation portion.

In this wired circuit board, the etchant allowed to penetrate into the covering portion spreads along the widthwise direction over the regulation portion that is received by at least the wide opening, so that it is possible to delay the penetration of the etchant in the opposite direction.

Moreover, the etchant spreading along the width direction contacts a large contact area of the regulation portion that is received by at least the wide opening, and the contact surface is dissolved by the etchant. Therefore, the etchant that has dissolved the contact surface has lower etching ability, so that the etchant is less likely to penetrate in the opposite direction. As a result, the regulation portion that is received in the wide opening can effectively prevent penetration of the etchant in the opposite direction.

In addition, residual etchant in contact with the regulation portion that is received in the wide opening can be easily removed by washing, so that possible contamination by the etchant can be avoided.

In the wired circuit board of the present invention, it is preferable that a bending opening formed so as to bend in a direction of crossing the opposite direction to the conductive pattern, in the covering portion, wherein at least the bending opening receives the regulation portion.

In this wired circuit board, since the regulation portion that is received by at least the bending opening bends in the opposite direction, the length of such regulation portion is inevitably longer than the straight line length of the regulation portion in the opposite direction. Therefore, even if the etchant allowed to penetrate into the covering portion contacts the regulation portion, the regulation portion that is received by at least the bending opening can regulate the penetration of the etchant in the opposite direction. As a result, dissolution and discoloration caused by the etchant in the conductive pattern can be prevented effectively.

DETAILED DESCRIPTION OF PREFERRED EMBODIMENTS

First Embodiment

Figure 1:
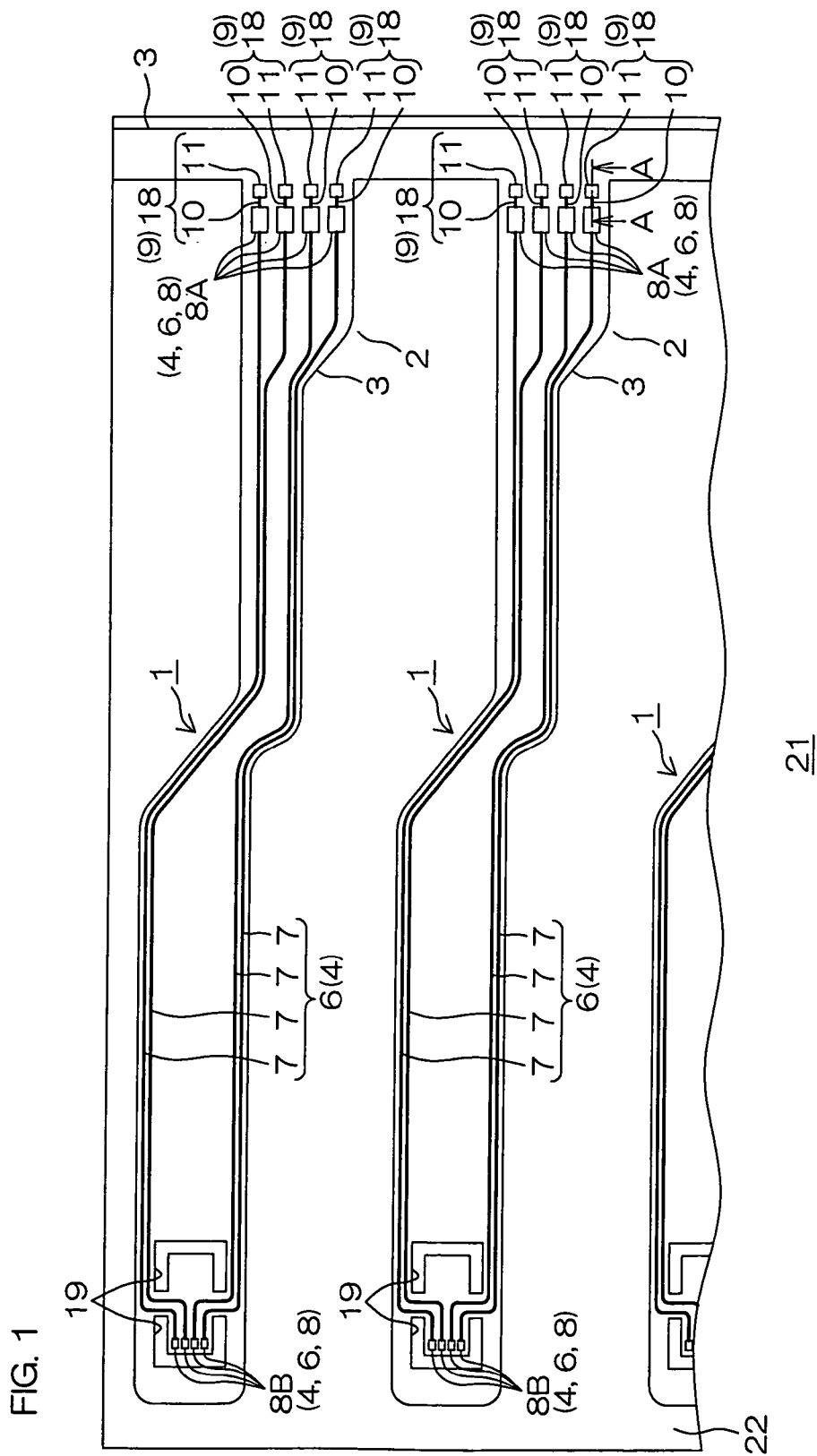
FIG. 1 shows a plan view of a wired circuit board assembly sheet provided with a plurality of first embodiments of a wired circuit board according to the present invention.
Figure 2:
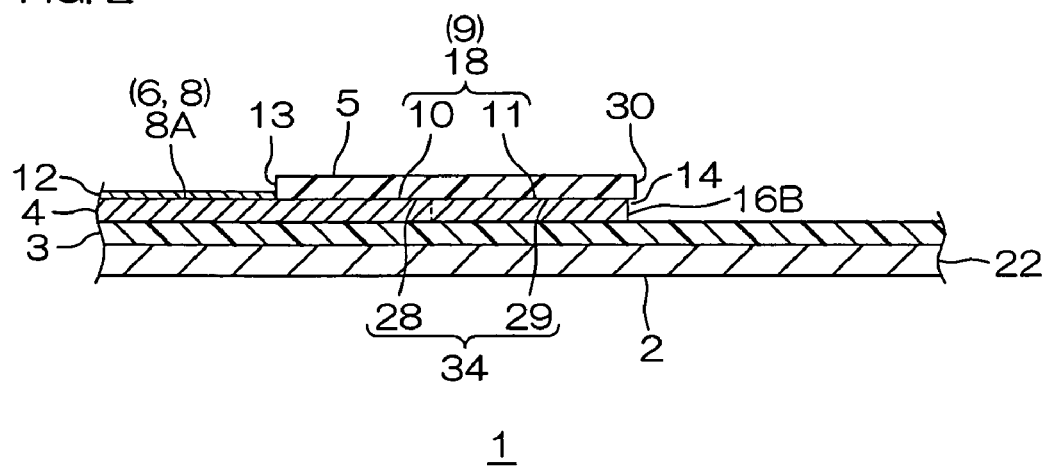
FIG. 2 shows a sectional view of the same taken along the line A-A of FIG. 1.
Figure 3:
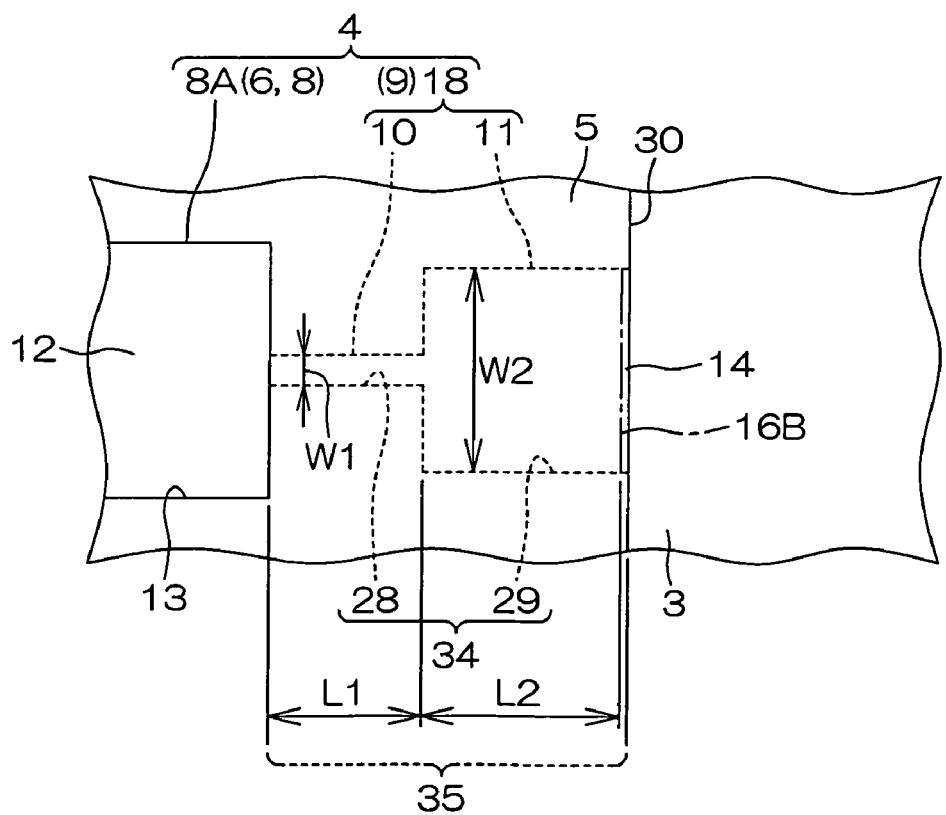
FIG. 3 shows an enlarged plan view of a second plating lead of the wired circuit board shown in FIG. 1.
Figure 4:
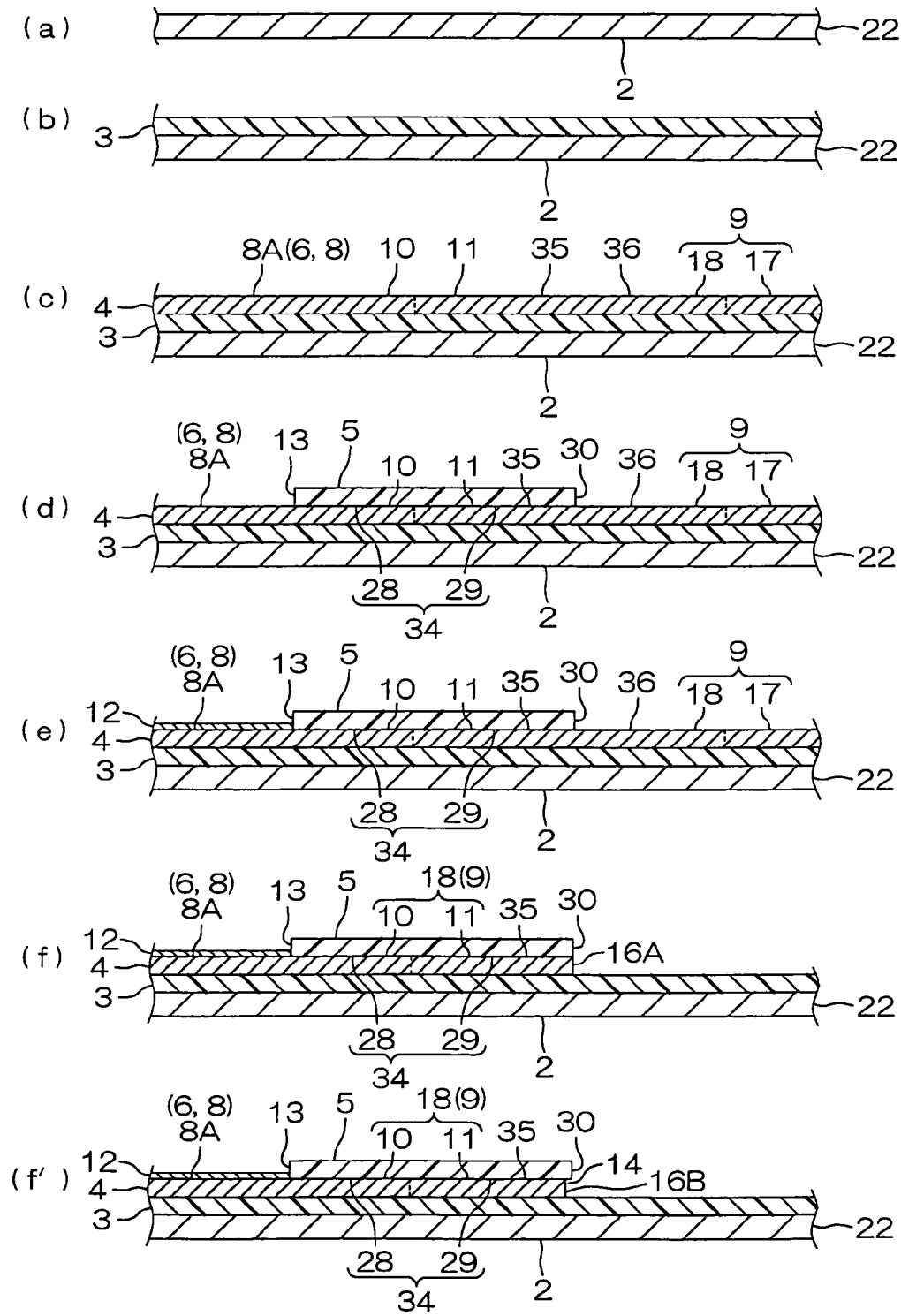
FIG. 4 is a process diagram of a production method of the wired circuit board assembly sheet shown in FIG. 1,
(a) showing the step of preparing a metal supporting board,
(b) showing the step of forming an insulating base layer on the metal supporting layer,
(c) showing the step of forming a conductive layer on the insulating base layer,
(d) showing the step of forming an insulating cover layer on the insulating base layer,
(e) showing the step of forming a plating layer on a surface of a terminal portion,
(f) showing the step of etching a plating lead, and
(f') showing the step of regulating penetration of an etchant.
Figure 5:
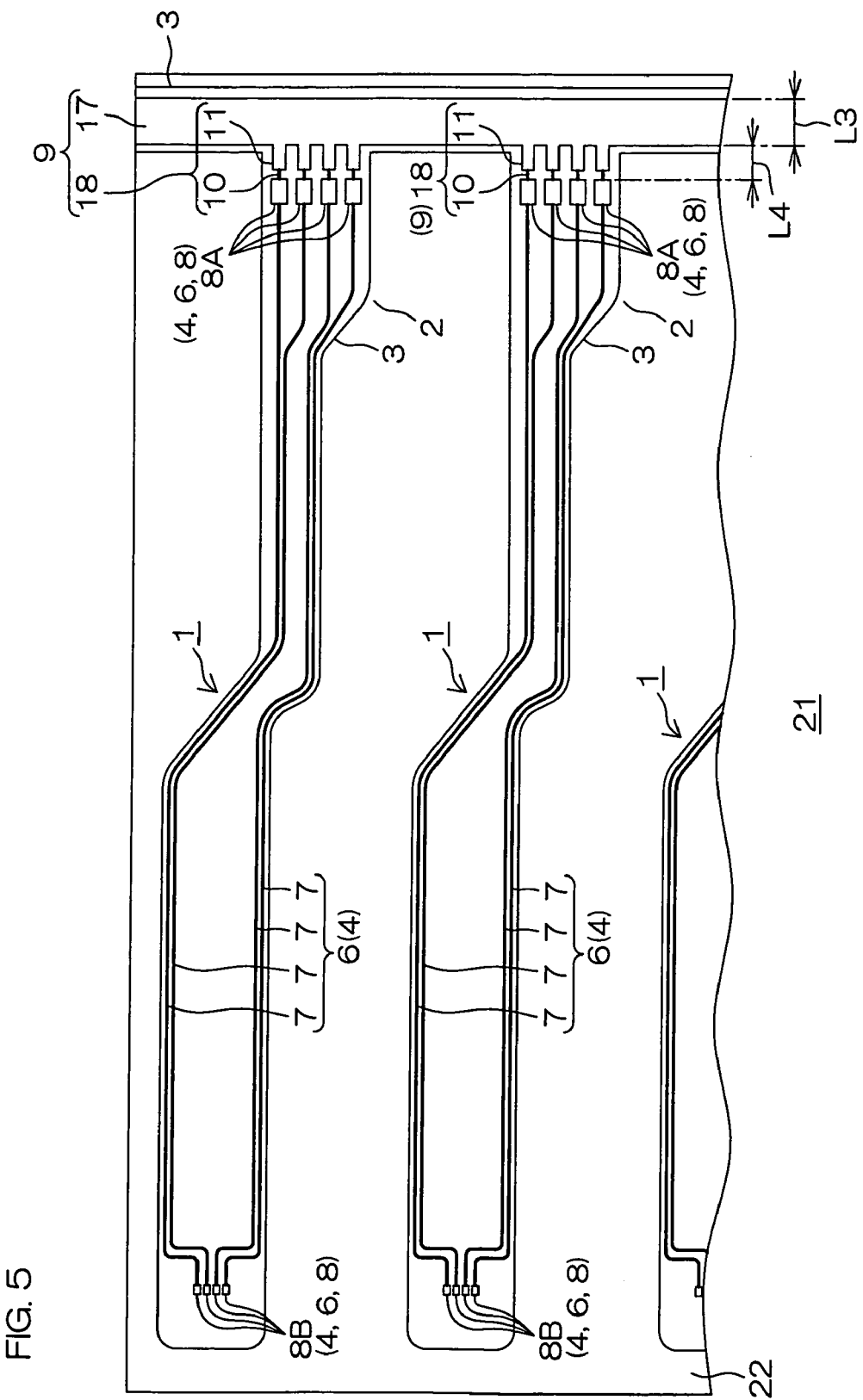
FIG. 5 shows a plan view of the wired circuit board assembly sheet in a production process in FIG. 4(c)
Figure 6:
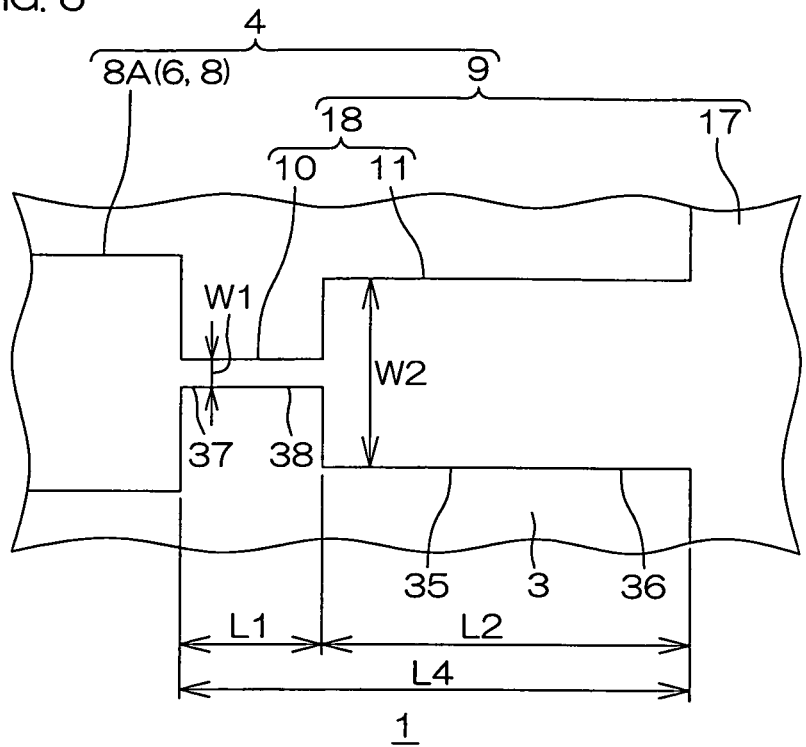
FIG. 6 shows an enlarged plan view of the plating lead of the wired circuit board assembly sheet in a production process in FIG. 4(c)
Figure 7:
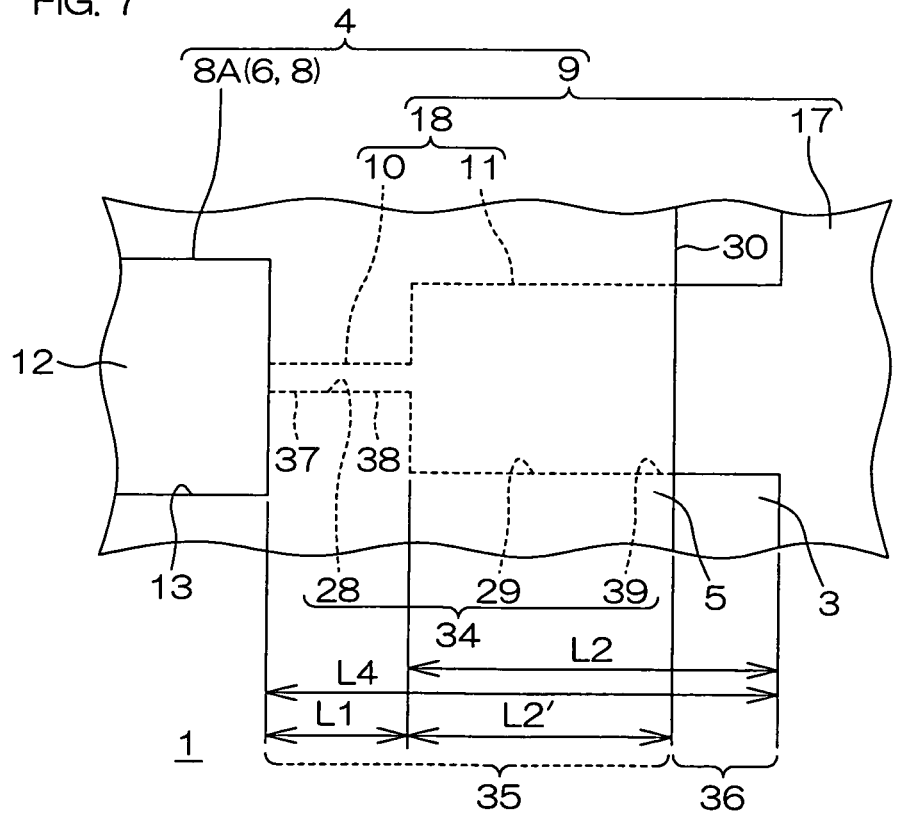
FIG. 7 shows an enlarged plan view of the plating lead of the wired circuit board assembly sheet in a production process in FIG. 4(d)

FIG. 1 shows a plan view of a wired circuit board assembly sheet provided with a plurality of first embodiments of a wired circuit board according to the present invention, FIG. 2 shows a sectional view of the same taken along the line A-A of FIG. 1, FIG. 3 shows an enlarged plan view of a second plating lead of the wired circuit board shown in FIG. 1, FIG. 4 is a process diagram of a production method of the wired circuit board assembly sheet shown in FIG. 1, FIG. 5 shows a plan view of the wired circuit board assembly sheet in a production process in FIG. 4(c), FIG. 6 shows an enlarged plan view of the plating lead of the wired circuit board assembly sheet in a production process in FIG. 4(c), and FIG. 7 shows an enlarged plan view of the plating lead of the wired circuit board assembly sheet in a production process in FIG. 4(d).

To clearly illustrate a relative position of a conductive layer 4, an insulating cover layer 5 and a plating layer 12 are omitted in FIG. 1.

In FIG. 1, a wired circuit board assembly sheet (hereinafter simply abbreviated as "sheet") 21 includes a plurality of wired circuit boards 1 such as a suspension board with circuit, each of the wired circuit boards 1 is arranged in an aligned state at spaced intervals to each other in a metal supporting board 22 having a generally rectangular sheet shape.

The wired circuit board 1 is formed in a generally rectangular flat band shape extending in a lengthwise direction (hereinafter referred to as front-to-end direction in some cases). As shown in FIG. 2, the wired circuit board 1 includes a metal supporting layer 2, an insulating base layer 3 formed on the metal supporting layer 2, a conductive layer 4 formed on the insulating base layer 3, and an insulating cover layer 5 formed on the insulating base layer 3 so as to cover the conductive layer 4.

The metal supporting layer 2 is formed from the metal supporting board 22. As a metallic material for forming the metal supporting board 22, for example, stainless steel or 42 alloy is used, or stainless steel is preferably used.

As shown in FIG. 1, the lengthwise other end (hereinafter referred to as rear end) portion of the metal supporting layer 2 has support openings 19 which sandwich magnetic side terminals 8B to be described later in the lengthwise direction.

The metal supporting layer 2 has a thickness in the range of, for example, 10 to 100 μm, or preferably 18 to 50 μm.

As an insulating material for forming the insulating base layer 3, for example, synthetic resin such as polyimide, polyether nitrile, polyether sulfone, polyethylene terephthalate, polyethylene naphthalate, or polyvinyl chloride is used. Of these synthetic resins, polyimide is preferably used.

The insulating base layer 3 is formed in a pattern corresponding to a portion where the conductive layer 4 is formed.

The insulating base layer 3 has a thickness in the range of, for example, 3 to 30 μm, or preferably 5 to 15 μm.

As a conductive material for forming the conductive layer 4, for example, a conductive material such as copper, nickel, gold, solder, or alloys thereof is used. Preferably, copper is used.

As shown in FIG. 2, the conductive layer 4 is formed on a surface of the insulating base layer 3, and integrally includes conductive patterns 6 and second plating leads 18 in the wired circuit board 1 after production.

As shown in FIG. 1, the conductive patterns 6 are arranged in spaced relation to each other in a widthwise direction (a direction orthogonal to the lengthwise direction of the wired circuit board 1), and each integrally includes a plurality of wires 7 extending along the lengthwise direction and terminal portions 8 continuous with both lengthwise end portions of each wire 7.

The terminal portions 8 include external terminals 8A arranged in the lengthwise one end (hereinafter referred to as front end) portions of the wires 7, and magnetic side terminals 8B arranged in the rear end portions of the wires 7.

The plurality of external terminals 8A are provided so as to be connected to the front end portions of the wires 7, respectively, and each formed as a square land. Each of the external terminals 8A is connected to a read/write board, which is not shown.

The plurality of magnetic side terminals 8B are provided so as to be connected to the rear end portions of the wires 7, respectively, and each formed as a square land. The magnetic side terminals 8B are connected to a magnetic head, which is not shown.

The plurality of second plating leads 18 are provided corresponding to the respective external terminals 8A. Specifically, the second plating leads 18 are arranged in spaced relation to each other in the widthwise direction, and each continuously formed on the front side of each of the external terminals 8A. Therefore, the second plating leads 18 are electrically connected with the conductive patterns 6.

Each of the second plating leads 18 is formed as a remaining portion obtained by dissolving a front end surface 16A (FIG. 4(f)) thereof with an etchant in the etching step (cf. FIGS. 4(f) and 4(f')) to be described later, to thereby recede rearward. That is, the front end surface 16A of the second plating lead 18 is formed as an eroded surface 16B (FIG. 4(f')) obtained by eroding the front end surface 16A rearward from a front end surface 30 of the insulating cover layer 5 with an etchant.

As shown in FIG. 3, the second plating lead 18 integrally includes a narrow portion 10 arranged adjacent to one side in the lengthwise direction (direction opposite to the external terminal 8A) of the external terminal 8A, specifically arranged forwardly adjacent to the external terminal 8A, and a wide portion 11 arranged on the front side of the narrow portion 10.

Before the etching step, the second plating lead 18 is formed from a front side portion 36 and a rear side portion 35, and after the etching step, the second plating lead 18 is formed only from the rear side portion 35 because the front side portion 36 is etched away in the etching step.

As shown in FIG. 3, the narrow portion 10 is formed so as to extend in the lengthwise direction, and has a generally rectangular shape in plane view having a narrow (short) width (length in widthwise direction) W1. Specifically, the narrow portions 10 is formed so as to extend toward the front side from the widthwise center of the front end portion of each of the external terminals 8A.

The wide portion 11 is arranged forwardly adjacent to the narrow portion 10, and is formed in a generally rectangular shape in plane view continuous with the narrow portion 10. More specifically, the wide portion 11 is formed in a generally rectangular shape in plane view with its rear end side being connected with the narrow portion 10.

Further, the wide portion 11 is arranged so as to contain the narrow portion 10 in the widthwise center thereof when the narrow portion 10 and the wide portion 11 are projected in the front-to-end direction. In other words, the width (length in widthwise direction) W2 of the wide portion 11 is wider (longer) than the width W1 of the narrow portion 10.

The eroded surface 16B of the wide portion 11 is positioned slightly shifted rearward from the front end surface 30 of the insulating cover layer 5 to be described later in the front-to-end direction.

The width W1 of the narrow portion 10 is in the range of, for example, 10 to 500 μm, or preferably 15 to 250 μm. The length L1 of the narrow portion 10 in the front-to-end direction is in the range of, for example, 10 to 500 μm, or preferably 15 to 250 μm.

In the case where the width W1 of the narrow portion 10 is set to 100%, the width W2 of the wide portion 11 is, for example, 150% or more, preferably 200% or more, or more preferably 250% or more, and usually 500% or less. The width W2 of the wide portion 11 is, for example, 15 μm or more, preferably 25 μm or more, or more preferably 50 μm or more, and usually 200 μm or less. The length L2 of the wide portion 11 in the front-to-end direction is, for example, 500 μm or less, or preferably 250 μm or less.

Each of the wires 7 has a width in the range of, for example, 10 to 300 μm, or preferably 15 to 150 μm, and the spacing (widthwise spacing) between each of the wires 7 is in the range of, for example, 10 to 200 μm, or preferably 15 to 50 μm. In addition, each of the terminal portions 8 has a width in the range of, for example, 15 to 200 μm, or preferably 50 to 100 μm, and the spacing (widthwise spacing) between each of the terminal portions 8 is in the range of, for example, 15 to 200 μm, or preferably 20 to 100 μm.

The conductive pattern 6 may have the same thickness as the second plating lead 18, and the conductive layer 4 has a thickness in the range of, for example, 3 to 20 μm, or preferably 7 to 15 μm.

As an insulating material for forming the insulating cover layer 5, the same insulating material as those for forming the insulating base layer 3 is used.

As shown in FIG. 2, the insulating cover layer 5 is formed on the insulating base layer 3 so as to cover the second plating leads 18 and the wires 7 (not shown in FIG. 2). As shown in FIG. 3, the insulating cover layer 5 has cover openings 13 each formed in a generally rectangular shape in plane view exposing the terminal portion 8.

As shown in FIG. 3, the front end portion of the insulating cover layer 5 contains the eroded surface 16B of the wide portion 11 in plane view, and is arranged in spaced relation forwardly to the eroded surface 16B in the front-to-end direction. That is, the front end surface 30 of the insulating cover layer 5 is arranged slightly forward from the eroded surface 16B of the wide portion 11 in the front-to-end direction. Therefore, a void 14 having the same shape in widthwise sectional view as the wide portion 11 is formed on the front side of the eroded surface 16B of the wide portion 11.

The insulating cover layer 5 is also provided with a covering portion 34 for covering the rear side portion 35 of the second plating lead 18 on the front side of each of the external terminals 8A. Specifically, the covering portion 34 is formed from the front ends of the external terminals 8A to the front end surface 30 of the insulating cover layer 5 in the front-to-end direction.

The insulating cover layer 5 has a thickness in the range of, for example, 2 to 20 μm, or preferably 4 to 15 μm.

Further, in the wired circuit board 1, as shown in FIG. 2, a plating layer 12 is provided on the surface of the terminal portion 8.

As a plating material for forming the plating layer 12, for example, a metallic material such as gold or nickel is used, or gold is preferably used. The plating layer 12 has a thickness in the range of, for example, 0.2 to 5 μm, or preferably 0.5 to 3 μm.

Next, a method for producing the suspension board with circuit 1 is described with reference to FIGS. 4 to 7.

In this method, first, a metal supporting board 22 for forming a metal supporting layer 2 is prepared, as shown in FIG. 4(a).

Then, in this method, as shown in FIG. 4(b), an insulating base layer 3 is formed on the metal supporting layer 2.

To form the insulating base layer 3, a solution (varnish) of the synthetic resin mentioned above is uniformly applied onto the upper surface of the metal supporting board 22 and then dried. Subsequently, the solution thus applied is heated to be cured as required. Alternatively, the insulating base layer 3 can be formed in the following manner. For example, a photosensitive varnish is coated over the upper surface of the metal supporting layer 2 and then dried. The coated varnish is then exposed to light in the above-mentioned pattern and then developed, and if necessary, heated to be cured. As a further alternative, the insulating base layer 3 can be formed in the following manner. For example, a synthetic resin is preliminarily formed on a film in the above-mentioned pattern, and the patterned film is adhesively sticked to the upper surface of the metal supporting layer 2 via a known adhesive layer.

Then, in this method, as shown in FIG. 4(c), a conductive layer 4 is formed on the insulating base layer 3 as a pattern integrally including a conductive pattern 6 and a plating lead 9.

As shown in FIGS. 5 and 6, the plating lead 9 is provided in order to feed electric power to the conductive pattern 6 for electrolytic plating in the step (cf. FIG. 4(e)) of forming a plating layer 12 to be described later. The plating lead 9 is also formed on the insulating base layer 3 as a pattern, as shown in FIGS. 5 and 6. Specifically, the plating lead 9 integrally includes a first plating lead 17 and a second plating lead 18.

The first plating lead 17 is provided one piece per sheet 21, and is specifically formed in a linear shape extending along the widthwise direction on a surface of the insulating base layer 3 on the front end side of the metal supporting board 22. The widthwise one end portion of the first plating lead 17 is electrically connected with a feed section which is not shown.

The plurality of second plating leads 18 are provided corresponding to the respective external terminals 8A, each being formed on the surface of the insulating base layer 3 corresponding to each wired circuit board 1. Specifically, as shown in FIG. 2, each of the second plating leads 18 is formed from the rear side portion 35 thereof by etching the front side portion 36 thereof in the etching step, and the rear side portion 35 is formed as a pattern integrally including a narrow portion 10 and a wide portion 11. In addition, in the second plating lead 18, the narrow portion 10 of the rear side portion 35 is formed continuously with the external terminal 8A, and the front side portion 36 is formed continuously with the first plating lead 17.

The front side portion 36 is formed so as to extend over a width equal to the width W2 of the wide portion 11 of the rear side portion 35 along the lengthwise direction. More specifically, each of the second plating leads 18 is formed so as to extend toward the front side from each of the external terminals 8A, reaching a midpoint on the rear end portion of the first plating lead 17 in the widthwise direction.

That is, the second plating leads 18 are in contact with the first plating lead 17 and the external terminals 8A, to thereby electrically connect therebetween.

The plating lead 9 is electrically connected with the feed section, which is not shown, and with the external terminal 8A, thereby electrically connecting between the feed section (not shown) and the external terminal 8A.

To form the conductive layer 4, a known patterning method, such as an additive method or a subtractive method is used. An additive method is preferably used.

In the additive method, first, a metal thin film (seed layer), which is not shown, is formed on the upper surface of the insulating base layer 3. The metal thin film that may be used include, for example, a metallic material such as copper, chromium, nickel, and alloys thereof. The metal thin film is formed by a method for forming a thin film, such as sputtering and plating.

Subsequently, a dry film resist is laminated on a surface of the metal thin film, exposed to light, and developed, so that a plating resist, which is not shown, is formed in a pattern reverse to the conductive layer 4. Then, the conductive layer 4 is formed on the surface of the metal thin film exposed from the plating resist by electrolytic plating. The plating resist and the metal thin film in a portion where the plating resist is formed are then removed by etching.

The size of the conductive layer 4 thus formed is appropriately selected, and the first plating lead 17 has a length L3 in the front-to-end direction of, for example, 30 µm or more, preferably 50 µm or more, or more preferably 100 µm or more, and usually 5000 µm or less, while the second plating lead 18 has a length (length in the front-to-end direction, i.e., spacing between the rear end edge of the first plating lead 17 and the rear end edge of the second plating lead 18) L4 in the range of, for example, 40 to 1000 µm, or preferably 60 to 500 µm.

Then, in this method, as shown in FIG. 4(d) and FIG. 7, the insulating cover layer 5 is formed on the insulating base layer 3 in the above-mentioned pattern.

The insulating cover layer 5 is provided with a covering portion 34. The covering portion 34 has openings corresponding to the rear side portion 35 of the second plating lead 18. Specifically, the covering portion 34 has an opening corresponding to the narrow portion 10 of the rear side portion 35 as a narrow opening 28, and an opening corresponding to the wide portion 11 of the rear side portion 35 as a wide opening 29.

The narrow opening 28 and the wide opening 29 receive the rear side portion 35 of the second plating lead 18, and the rear side portion 35 is formed as a regulation portion for regulating penetration of an etchant into the external terminal 8A in the subsequent etching step (cf. FIGS. 4(f) and 4(f')).

The wide opening 29 has a length L2' in the front-to-end direction in the range of, for example, 10 to 550 µm, or preferably 15 to 300 µm.

To form the insulating cover layer 5, for example, a solution (varnish) of a photosensitive synthetic resin is applied onto the upper surface of the insulating base layer 3 including the conductive layer 4, and then dried. The solution thus applied is then exposed to light in the above-mentioned pattern and developed, and if necessary, heated to be cured. Alternatively, the insulating cover layer 5 can be formed in the following manner. For example, a synthetic resin is preliminarily formed on a film in the above-mentioned pattern, and the patterned film is adhesively sticked to the upper surface of the insulating base layer 3 including the conductive layer 4 via a known adhesive layer.

Then, in this method, as shown in FIG. 4(e), a plating layer 12 is formed on the surface of the terminal portion 8 exposed from the cover opening 13.

The plating layer 12 is formed by electrolytic plating by feeding electric power to the conductive pattern 6 through the first plating lead 17 and the second plating lead 18.

In the electrolytic plating, first, a plating resist is formed on the surface of the conductive layer 4 except the surface of the terminal portion 8, and the surface of the metal supporting board 22. Then, while the metal supporting board 22 is immersed in an electrolytic plating bath, electric power is fed from the feed section, which is not shown, to the terminal portion 8 through the first plating lead 17 and the second plating lead 18. Thereafter, the plating resist is removed.

Then, in this method, as shown in FIGS. 4(f) and 4 (f'), the first plating lead 17 and the front side portions 36 of the second plating leads 18 are etched while the rear side portions 35 of the second plating leads 18 regulate penetration of the etchant into the external terminals 8A.

As a method of etching the first plating lead 17 and the front side portions 36 of the second plating leads 18 while the penetration of the etchant is regulated, for example, wet etching (chemical etching) is used.

Specifically, first, an etching resist, which is not shown, is laminated on surfaces of the plating layer 12 and the metal supporting board 22. Then, the metal supporting board 22 on which the etching resist is laminated is immersed in an etchant. The etchant that may be used include, for example, a known etchant (chemical agent), such as an aqueous ferric chloride solution.

Subsequently, the metal supporting board 22 is washed with a washing solvent such as water, methanol, and acetone (washing process), and then dried. The etching resist is then removed by etching or peeling.

Thus, the first plating lead 17 and the front side portions 36 of the second plating leads 18 are removed.

In this etching step, as shown in FIG. 4(f), etching conditions are usually established so that the front end surface (front end surface of the wide portion 11) 16A of the rear side portion 35 of each of the second plating leads 18 is formed so as to be positioned generally flush with the front end surface 30 of the insulating cover layer 5 in the thickness direction and in the widthwise direction.

However, after removal of the first plating lead 17 and the front side portions 36 of the second plating leads 18, a part of the rear side portion 35 is etched.

Here, as shown in FIG. 4(f), the wide portion 11 regulates penetration of the etchant into the external terminal 8A.

More specifically, excessive etching (over-etching) of the wide portion 11 dissolves the conductive material, whereby the front end surface 16A of the wide portion 11 recedes rearward, specifically, on the way from the front end to the rear end of the wide opening 29 in the front-to-end direction. As a result, the front end surface 16A is positioned shifted rearward from the front end surface 30 of the insulating cover layer 5. Alternatively, residual etchant on the front end surface 16A of the wide portion 11 dissolves the conductive material between after the etching step and before the washing step, whereby the front end surface 16A of the wide portion 11 recedes rearward to thereby be positioned shifted rearward from the front end surface 30 of the insulating cover layer 5.

Then, such receding of the front end surface 16A of the wide portion 11 results in formation of an eroded surface 16B.

Specifically, the eroded surface 16B is arranged in spaced relation to the external terminal 8A in the front-to-end direction, and the spacing between the eroded surface 16B and the external terminal 8A is a spacing (capable of regulating the penetration of the etchant into the external terminal 8A) in which the wide portion 11 and the narrow portion 10 remain without being eroded by an etchant.

More specifically, the wide opening 29 allows the etchant to penetrate into the rear side. Thus, the front end surface 16A of the wide portion 11 recedes rearward to form the eroded surface 16B, thereby regulating the penetration of the etchant farther to the rear side.

Thereafter, as shown in FIG. 1, the metal supporting board 22 is cut out by etching to form a support opening 19, thereby obtaining a sheet 21 having a plurality of wired circuit boards 1 formed thereon.

In this method, the conductive pattern 6 is integrally formed with the second plating lead 18 provided with the wide portion 11 and the first plating lead 17. Thereafter, the front side portion 36 of the second plating lead 18 and the first plating lead 17 are etched with an etchant while the wide portion 11 regulates the penetration of the etchant into the external terminal 8A.

Specifically, after the front side portion 36 of the second plating lead 18 and the first plating lead 17 are etched with an etchant, the wide opening 29 in the covering portion 34 allows penetration of the etchant, so that the etchant contacts the wide portion 11.

Therefore, after the electrolytic plating by feeding electric power to the external terminal 8A through the first plating lead 17 and the second plating lead 18, the wide portion 11 can prevent the etchant from penetrating into the external terminal 8A.

In the wide portion 11 (wide portion 11 received in the wide opening 29), the etchant spreads along the widthwise direction, so that it is possible to delay the penetration of the etchant to the rear side.

Further, the etchant spreading along the widthwise direction contacts a large contact area of the wide portion 11 (wide portion 11 received in the wide opening 29), and the contact surface (front end surface 16A) is dissolved by the etchant. Therefore, the etchant that has dissolved the contact surface (front end surface 16A) has lower etching ability, so that the etchant is less likely to penetrate to the rear side. As a result, the wide portion 11 (wide portion 11 received in the wide opening 29) can effectively prevent the penetration of the etchant to the rear side.

In addition, residual etchant in contact with the wide portion 11 (wide portion 11 received in the wide opening 29) can be easily removed by washing, so that possible contamination by the etchant can be avoided.

In the above explanation, although the regulation portion is provided in the form of the wide portion 11 having a wide width, it may have a predetermined or larger contact area with the etchant. For example, the regulation portion can be provided in the form of a thick film portion, though not shown.

Further, in the above explanation, the second plating lead 18 is formed continuously with the external terminal 8A. However, for example, the second plating lead 18 can be formed continuously with the magnetic side terminal 8B or the wire 7, though not shown.

In the above explanation, the wired circuit board of the present invention has been illustrated with the suspension board with circuit including the metal supporting board 2. However, the wired circuit board of the present invention is not limited thereto, and can be widely applied to other wired circuit boards, such as a flexible wired circuit board having the metal supporting board 2 provided as a reinforcing layer, and a flexible wired circuit board not having the metal supporting board 2.

Figure 8:
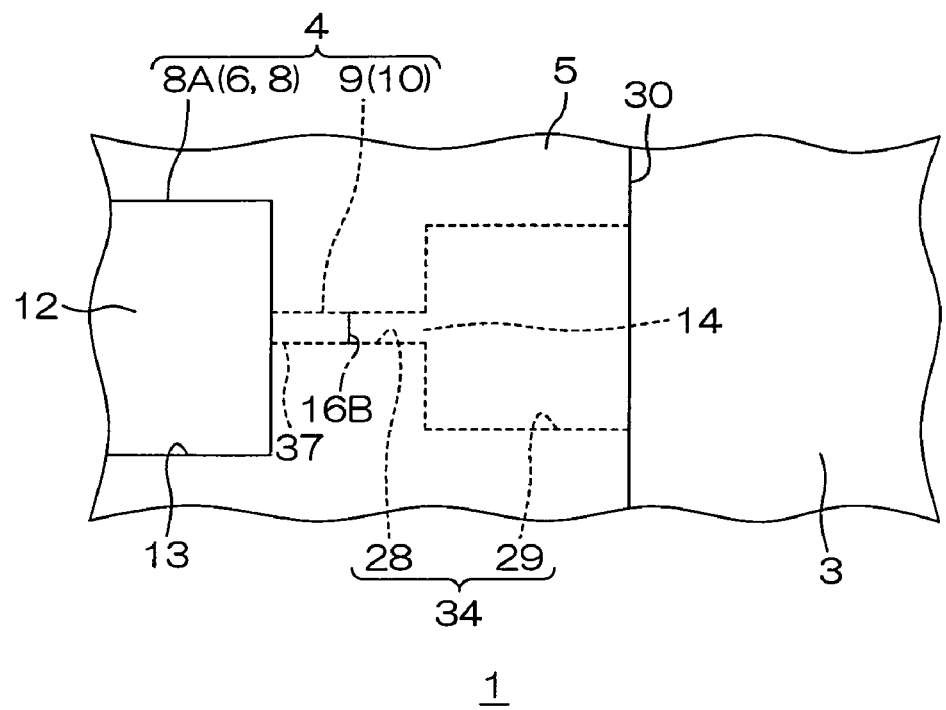
FIG. 8 shows an enlarged plan view of a second plating lead as a modification (a mode in which the wide portion and the narrow portion serve as regulation portions and the narrow portion remains) of the first embodiment.
Figure 9:
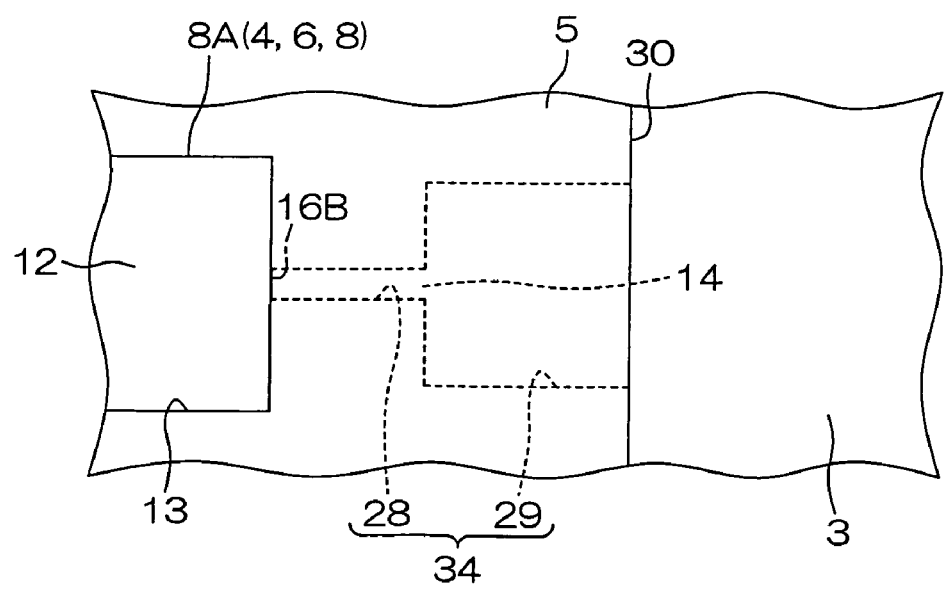
FIG. 9 shows an enlarged plan view of a second plating lead as a modification (a mode in which the wide portion and the narrow portion serve as regulation portions and the narrow portion does not remain) of the first embodiment.
Figure 10:
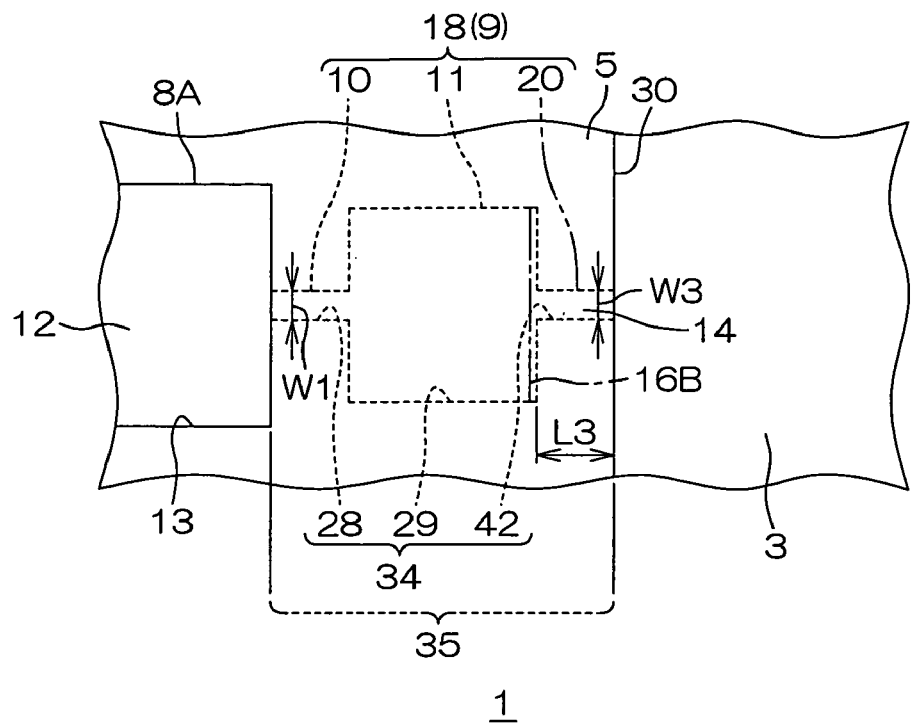
FIG. 10 shows an enlarged plan view of a second plating lead as a modification (a mode in which the front side narrow portion and the wide portion serve as regulation portions) of the first embodiment.
Figure 11:
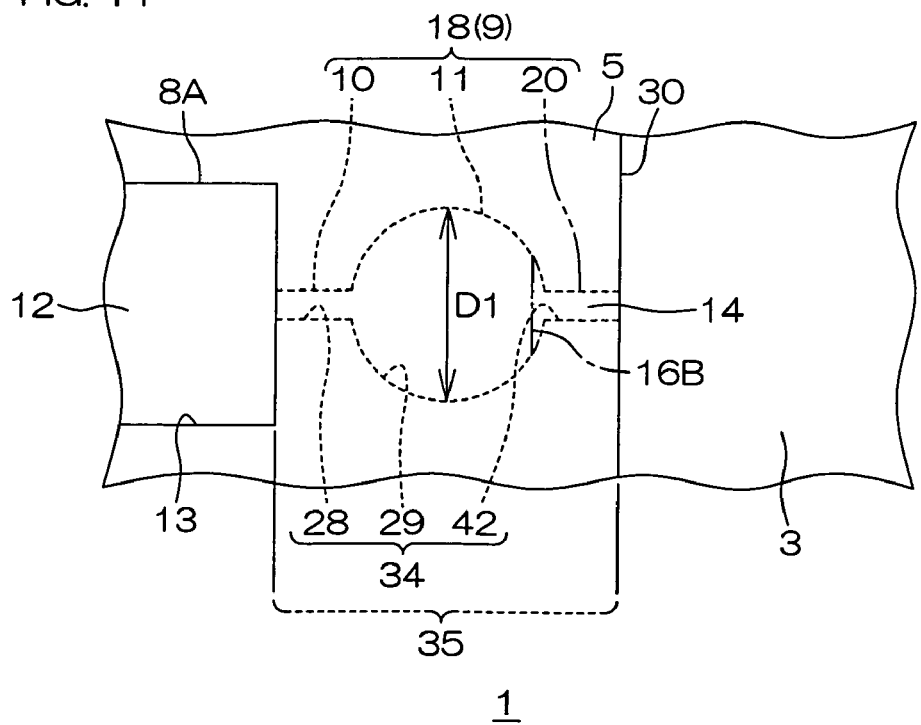
FIG. 11 shows an enlarged plan view of a second plating lead as a modification (a mode in which the wide portion has a generally circular shape in plane view) of the first embodiment.
Figure 12:
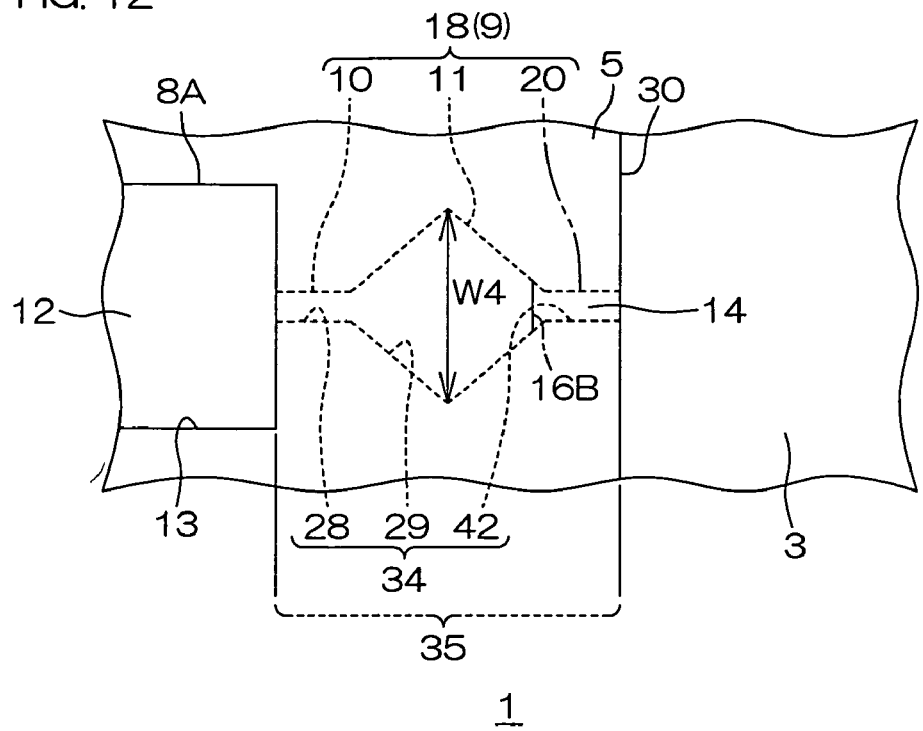
FIG. 12 shows an enlarged plan view of a second plating lead as a modification (a mode in which the wide portion has a generally diamond shape in plane view) of the first embodiment.
Figure 13:
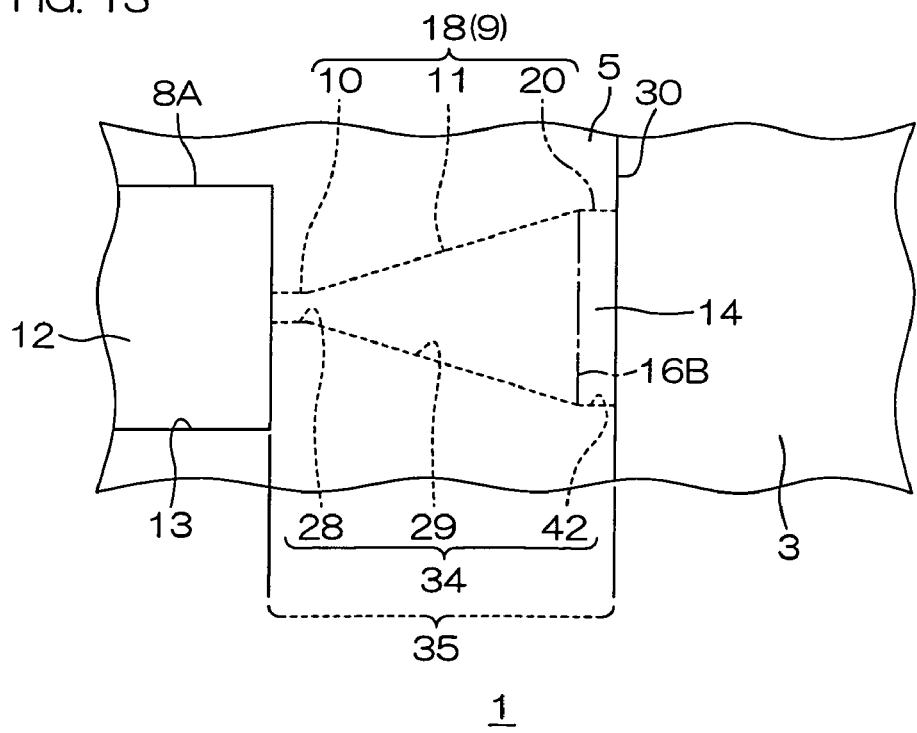
FIG. 13 shows an enlarged plan view of a second plating lead as a modification (a mode in which the wide portion has a generally triangular shape in plane view) of the first embodiment.
Figure 14:
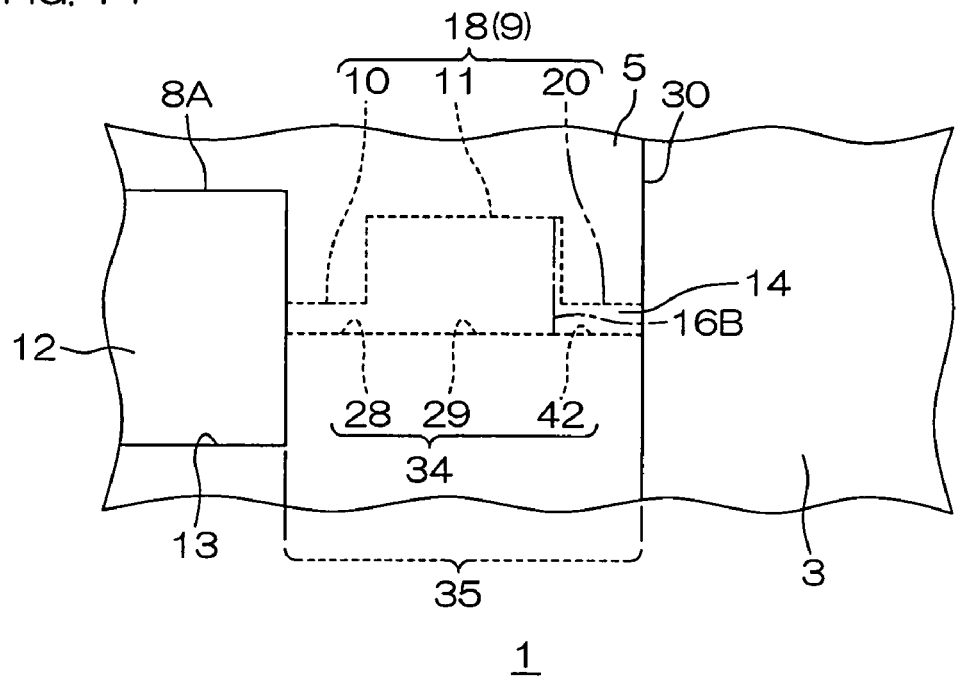
FIG. 14 shows an enlarged plan view of a second plating lead as a modification (a mode in which the wide portion protrudes on one side in the widthwise direction more than the narrow portion) of the first embodiment.

FIGS. 8 to 14 are enlarged plan views of a second plating lead as modifications of the first embodiment mentioned above, FIG. 8 showing a mode in which the wide portion and the narrow portion serve as regulation portions and the narrow portion remains, FIG. 9 showing a mode in which the wide portion and the narrow portion serve as regulation portions and the narrow portion does not remain, FIG. 10 showing a mode in which the front side narrow portion and the wide portion serve as regulation portions, FIG. 11 showing a mode in which the wide portion has a generally circular shape in plane view, FIG. 12 showing a mode in which the wide portion has a generally diamond shape in plane view, FIG. 13 showing a mode in which the wide portion has a generally triangular shape in plane view, and FIG. 14 showing a mode in which the wide portion protrudes on one side in the widthwise direction more than the narrow portion.

The same reference numerals are used in each of the subsequent figures for the same members as those above, and the description thereof is omitted.

In the above explanation, although only the wide portion 11 serves as the regulation portion to regulate the penetration of the etchant into the external terminals 8A in the etching step shown in FIGS. 4(f) and 4(f'), at least the wide portion 11 may be included as the regulation portion. For example, referring to FIGS. 8 and 9, both the wide portion 11 and the narrow portion 10 can serve as the regulation portion.

More specifically, referring to FIG. 7, the entire wide portion 11 and the front side portion of the narrow portion 10 are dissolved at the etching step in the production of the wired circuit board 1 shown in FIG. 8. In other words, the wide portion 11 received in the wide opening 29 and the narrow portion 10 received in the narrow opening 28 serve as the regulation portions that regulate the penetration of the etchant into the external terminal 8A.

Specifically, in the etching step, in the portions where the wide portion 11 and the front side portion of the narrow portion 10 are dissolved, the wide opening 29 and the narrow opening 28 in the covering portion 34 which receive those portions, allow the etchant to penetrate to the rear side. Then, the eroded surface 16B formed on the narrow portion 10 regulates the penetration of the etchant farther to the rear side.

The eroded surface 16B of the narrow portion 10 is formed on the way from the front end to the rear end of the narrow opening 28 in the front-to-end direction.

Therefore, a void 14 corresponding to the wide portion 11 and the front side portion of the narrow portion 10 is formed in the front side of the eroded surface 16B of the narrow portion 10.

Thus, only a rear side portion 37 of the narrow portion 10 remains in the wired circuit board 1 after the etching step.

Alternatively, the entire wide portion 11 and the entire narrow portion 10 are dissolved at the etching step in the production of the wired circuit board 1 shown in FIG. 9.

The eroded surface 16B is formed on the rear end of the narrow opening 28. The eroded surface 16B is flush with the front end surface of the external terminal 8A.

Therefore, the void 14 corresponding to the wide portion 11 and the narrow portion 10 is formed on the front side of the eroded surface 16B (on the front end surface of the external terminal 8A). That is, the void 14 is formed in the same shape as the rear side portion 35 of the second plating lead 18.

Thus, the second plating lead 18 is entirely etched and does not remain in the wired circuit board 1 after the etching step.

In the above explanation, the wide portion 11 serves as a regulation portion. However, for example, as shown in FIG. 10, in addition to the wide portion 11, a front side narrow portion 20 which is formed forward of and narrower than the wide portion 11 can also serve as a regulation portion.

In the formation of the conductive layer 4 shown in FIG. 4(c), the rear side portion 35 of the second plating lead 18 is formed as a pattern integrally including the narrow portion 10, the wide portion 11, and the front side narrow portion 20.

The wide portion 11 is formed on the way in the front-to-end direction of the rear side portion 35 of the second plating lead 18, as shown in FIG. 10.

Referring to FIG. 10, the front side narrow portion 20 is formed continuously with the front end portion of the wide portion 11, as shown in phantom line. The width W3 of the front side narrow portion 20 is, for example, the same as the width W1 of the narrow portion 10, or preferably in the range of 15 to 250 µm. The length L3 of the front side narrow portion 20 is in the range of, for example, 10 to 500 µm, or preferably 15 to 250 µm.

The front side narrow portion 20 and the front side portion of the wide portion 11 are subsequently etched in the etching step shown in FIGS. 4(f) and 4(f'). Thus, the eroded surface 16B is formed on the way from the front end to the rear end of the wide opening 29 in the front-to-end direction.

In the above explanation, although the wide portion 11 is formed in a generally rectangular shape in plane view, it can be formed in an appropriate shape. For example, the wide portion 11 can be formed in a generally circular shape in plane view, as shown in FIG. 11; alternatively, in a generally diamond shape in plane view, as shown in FIG. 12; and further alternatively, in a generally triangular shape in plane view, as shown in FIG. 13.

In FIG. 11, the wide portion 11 having a generally circular shape in plane view has an inner diameter D1 in the range of, for example, 15 to 500 µm, or preferably 30 to 250 µm.

In FIG. 12, two opposite vertexes in the front-to-end direction of the wide portion 11 having a generally diamond shape in plane view are each connected to the narrow portion 10 and the front side narrow portion 20. The wide portion 11 has a maximum width W4 in the range of, for example, 15 to 500 µm, or preferably 30 to 250 µm.

In FIG. 13, the wide portion 11 is formed in a generally isosceles triangular shape in plane view tapering rearwardly. Specifically, the wide portion 11 is formed in a generally triangular shape in plane view (a tapering shape in plane view) so that two sides of equal length extend in the front-to-end direction and gradually approach to each other as they extends rearwardly.

In the above explanation, the wide portion 11 is arranged so as to contain the narrow portion 10 in the widthwise center thereof when the narrow portion 10 and the wide portion 11 are projected in the front-to-end direction. However, for example, as shown in FIG. 14, the wide portion 11 can be arranged so as to contain the narrow portion 10 on the other end side in the widthwise direction. More specifically, the wide portion 11 is formed so as to protrude on one side in the widthwise direction more than the narrow portion 10.

In the above explanation, the rear side portion 35 of the second plating lead 18 is provided with the narrow portion 10 and the wide portion 11. However, for example, the rear side portion 35 can be provided only with the wide portion 11, without having the narrow portion 10, though not shown.

Second Embodiment

Figure 15:
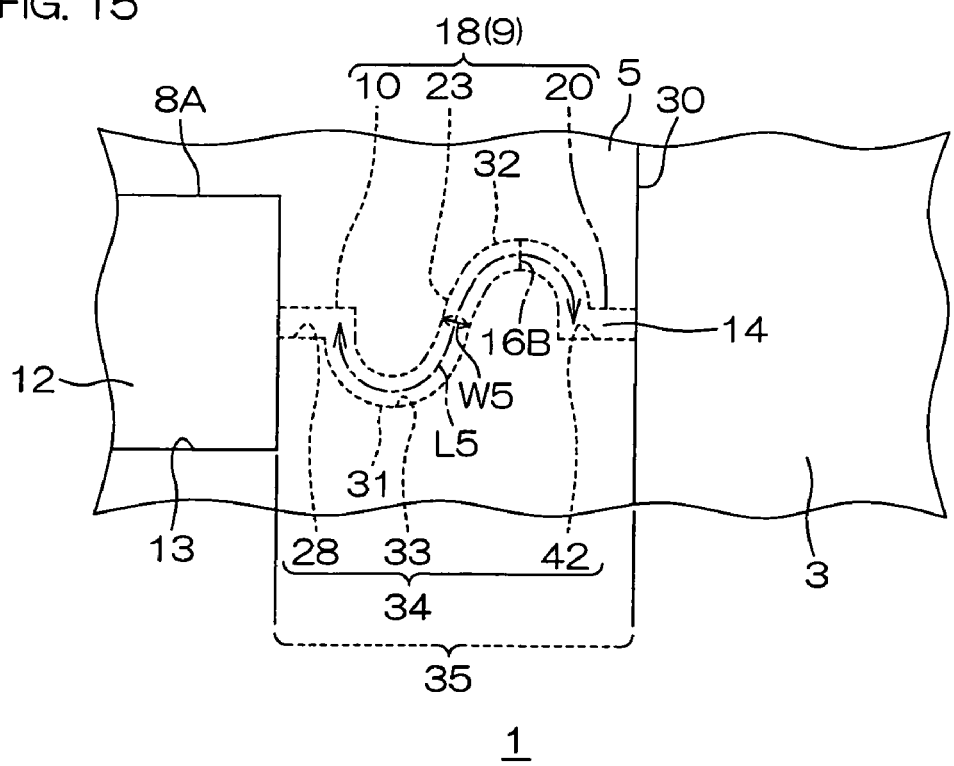
FIG. 15 shows an enlarged plan view of a second plating lead of a second embodiment (a mode in which a bending portion has a generally S-shape in plane view) of a wired circuit board according to the present invention.

FIG. 15 shows an enlarged plan view of a second plating lead of a second embodiment of a wired circuit board according to the present invention.

In the above description, the wide portion 11 is provided as a regulation portion. However, as shown in FIG. 11, for example, a bending portion 23 can be provided as the regulation portion.

In FIG. 15, the rear side portion 35 of the second plating lead 18 includes the narrow portion 10 and the bending portion 23.

The bending portion 23 is formed so as to bend in a direction of crossing the front-to-end direction. Specifically, the bending portion 23 is formed in a generally S-shape in plane view having a uniform width.

More specifically, the bending portion 23 integrally includes a first curve 31 which protrudes on one side in the widthwise direction and curves arcuately, and a second curve 32 which protrudes on the other side in the widthwise direction from the front end of the first curve 31 and curves arcuately.

The width W5 of the bending portion 23 is the same as the width W1 of the narrow portion 10 mentioned above.

Therefore, as shown in dashed lines in FIG. 15, the length L5 of the bending portion 23 (bending portion 23 prior to the etching step), i.e., the length L5 of a line segment passing through the widthwise center of the bending portion 23 is set in the range of, for example, 100 to 500 µm, or preferably 150 to 350 µm.

In the conductive layer 4 formed in the step of forming the conductive layer 4 shown in FIG. 4(c), the rear side portion 35 of the second plating lead 18 integrally includes the narrow portion 10, the bending portion 23, and the front side narrow portion 20.

Then, referring to FIG. 4(d), the insulating cover layer 5 is formed so as to cover the narrow portion 10, the bending portion 23, and the front side narrow portion 20, to thereby form a covering portion 34 which contains these portions.

The covering portion 34 has an opening corresponding to the bending portion 23 formed as a bending opening 33, and an opening corresponding to the front side narrow opening 20 formed as a front side narrow opening 42. The narrow opening 28, the bending opening 33, and the front side narrow opening 42 receive the rear side portion 35 of the second plating lead 18.

Subsequently, referring to FIGS. 4(f) and 4 (f'), in the step of etching the first plating lead 17 and the front side portion 36 of the second plating lead 18, the front side narrow portion 20 and the bending portion 23 regulate the penetration of the etchant into the external terminal 8A.

Thus, the eroded surface 16B is formed on the way in the front-to-end direction of the bending portion 23.

Specifically, the front side narrow opening 42 and the bending opening 33 allow the etchant to penetrate to the rear side. Thus, the front end surface 16A recedes rearward to form the eroded surface 16B, thereby regulating the penetration of the etchant farther to the rear side.

In the wired circuit board 1, the total length of the length of the front side narrow portion 20 and the length L5 of the bending portion 23 (bending portion 23 prior to the etching step, which is received in the bending opening 33) is inevitably longer than the straight line length in the front-to-end direction between the front side narrow portion 20 and the bending portion 23.

Therefore, even if the etchant that is allowed to penetrate into the front side narrow opening 42 and the bending opening 33 contacts the front side narrow portion 20 and the bending portion 23, these portions can regulate the penetration of the etchant to the rear side.

As a result, dissolution and discoloration caused by the etchant in the external terminal 8A can be prevented effectively.

In the above explanation, the rear side portion 35 of the second plating lead 18 is formed from the narrow portion 10, the bending portion 23, and the front side narrow portion 20. However, for example, the rear side portion 35 can be formed from the narrow portion 10 and the bending portion 23, without having the front side narrow portion 20. In such case, only the bending portion 23 serves as a regulation portion, or the bending portion 23 and the narrow portion 10 serve as regulation portions, to regulate penetration of the etchant.

Figure 16:
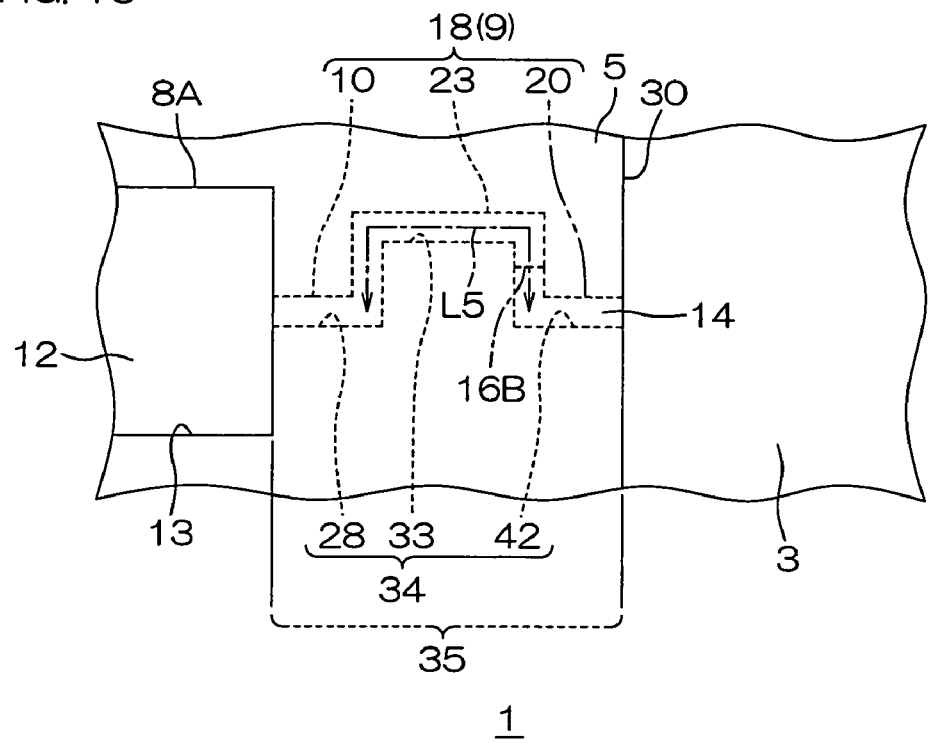
FIG. 16 shows an enlarged plan view of a second plating lead as a modification (a mode in which the bending portion has a generally flat-bottomed U-shape in plane view) of the second embodiment.
Figure 17:
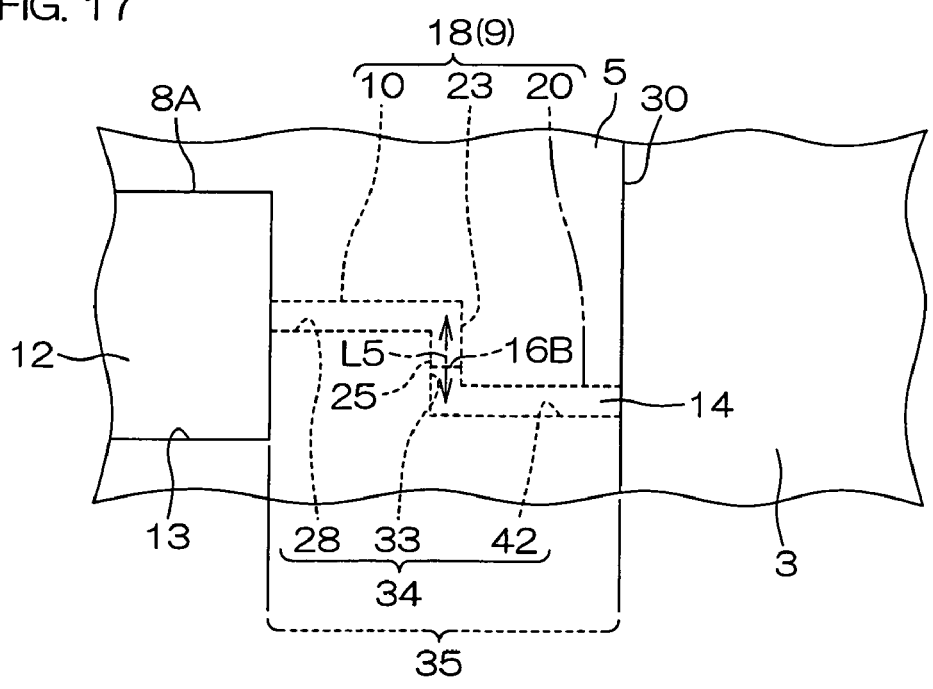
FIG. 17 shows an enlarged plan view of a second plating lead as a modification (a mode in which the bending portion has a stepwise shape in plane view) of the second embodiment.
Figure 18:
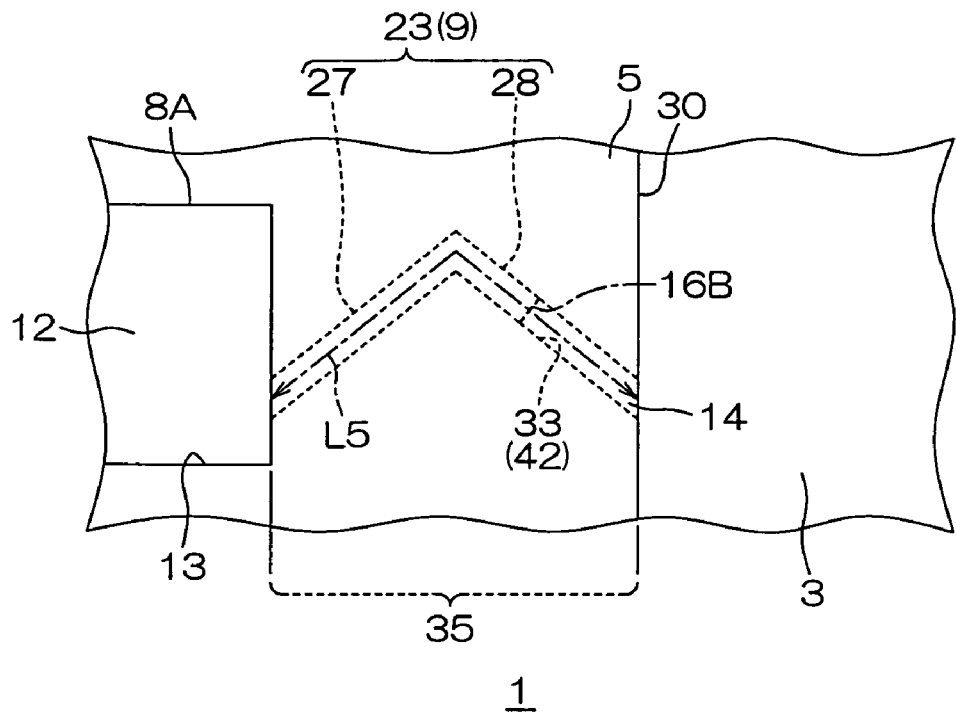
FIG. 18 shows an enlarged plan view of a second plating lead as a modification (a mode in which the bending portion has a generally V-shape in plane view) of the second embodiment.

FIGS. 16 to 18 are enlarged plan views of a second plating lead as modifications of the second embodiment mentioned above, FIG. 16 showing a mode in which the bending portion has a generally flat-bottomed U-shape in plane view, FIG. 17 showing a mode in which the bending portion has a stepwise shape in plane view, and FIG. 18 showing a mode in which the bending portion has a generally V-shape in plane view.

In the above explanation, the bending portion 23 is formed in a generally S-shape in plane view. However, for example, the bending portion 23 can be formed in a generally flat-bottomed U-shape in plane view (cf. FIG. 16), in a stepwise shape in plane view (cf. FIG. 17), or in a generally V-shape in plane view (cf. FIG. 18).

In FIG. 16, the bending portion 23 is formed in a generally flat-bottomed U-shape in plane view. The bending portion 23 is arranged so as to open to the other side in the widthwise direction, and the rear end portion of the bending portion 23 is connected with the narrow portion 10.

In FIG. 17, the bending portion 23 is formed in a stepwise shape in plane view. The rear side portion 35 of the second plating lead 18 includes the narrow portion 10 and a straight line portion 25 extending from the front end portion of the narrow portion 10 toward the other side in the widthwise direction.

The straight line portion 25 is arranged in parallel relation to the front end surface 30 of the insulating cover layer 5. Further, the straight line portion 25 is formed so as to bend from the front end portion of the narrow portion 10 to the other side in the widthwise direction.

In FIG. 18, the bending portion 23 is formed in a generally V-shape in plane view bending on the way in the front-to-end direction. More specifically, the rear side portion 35 of the second plating lead 18 includes the bending portion 23 integrally having a first inclined portion 27 formed continuously with the front end portion of the external terminal 8A and a second inclined portion 28 continuous with the front end portion of the first inclined portion 27 and arranged on the front side of the first inclined portion 27.

The first inclined portion 27 is formed in a generally rectangular shape in plane view extending from the front end portion of the external terminal 8A diagonally forward to one side in the widthwise direction.

The second inclined portion 28 is formed in a generally rectangular shape in plane view bending from the front end portion of the first inclined portion 27 to the other side in the widthwise direction, and extending diagonally forward to the other side in the widthwise direction.

Third Embodiment

The regulation portion is described as at least the wide portion 11 and as at least the bending portion 23 in the first and the second embodiment mentioned above, respectively. However, for example, the regulation portion can be both the wide portion 11 and the bending portion 23, though not shown.

EXAMPLES

While in the following, the present invention is described in further detail with reference to Example and Comparative Example, the present invention is not limited to any of them.

Example 1

First, a metal supporting board made of a 25 μm-thick stainless steel was prepared (cf. FIG. 4(a)). Then, a varnish of a photosensitive polyamic acid resin was coated on the upper surface of the metal supporting layer and dried. Thereafter, the dried varnish was exposed to light, developed, and further heated to be cured, so that an insulating base layer made of polyimide having a thickness of 10 μm was formed in the above-mentioned pattern (cf. FIG. 4(b)).

Next, a 0.03 μm-thick thin chromium film and a 0.07 μm-thick thin copper film were sequentially formed as a metal thin film on the upper surface of the insulating base layer by chromium sputtering and copper sputtering. Subsequently, a dry film resist was laminated on a surface of the metal thin film, exposed to light, and developed to form a plating resist in a pattern reverse to a conductive layer. Next, a 10 μm-thick conductive layer is formed on the surface of the metal thin film exposed from the plating resist by electrolytic copper plating. Thereafter, the plating resist and the portion of the metal thin film where the plating resist was formed were removed by etching (cf. FIG. 4(c)).

The conductive layer integrally included a conductive pattern having wires and terminal portions, a first plating lead having a narrow portion and a wide portion in the rear side portion thereof, and a second plating lead (cf. FIGS. 5 and 6).

Each of the wires had a width of 20 μm and the spacing between each of the wires was 20 μm. Each of the terminal portions had a width of 100 μm and the spacing between each of the terminal portions was 30 μm.

The first plating lead had a length (L3) in the front-to-end direction of 500 μm.

In the second plating lead, the narrow portion had a width (W1) of 20 μm and a length (L1) in the front-to-end direction of 30 μm; and the wide portion had a width (W2) of 50 μm and a length (L2) in the front-to-end direction of 100 μm.

Next, a varnish of a photosensitive polyamic acid resin was coated on the upper surface of the insulating base layer including the conductive layer and dried. Thereafter, the dried varnish was exposed to light, developed, and further heated to be cured, so that an insulating cover layer made of polyimide having a thickness of 10 μm was formed in a pattern having a cover opening (cf. FIG. 4(d)).

The insulating cover layer was provided with a covering portion on the front side of the external terminals, the covering portion having a narrow opening and a wide opening receiving the rear side portion of the second plating lead. The wide opening had a length (L2') in the lengthwise direction of 80 μm.

Next, a plating resist was formed on surfaces of the conductive layer and the metal supporting board, except the surfaces of the terminal portions. Subsequently, a 2 μm-thick plating layer made of gold was formed on the surfaces of the respective terminal portions by electrolytic gold plating by feeding electric power to the terminal portions through the first plating lead and the second plating lead (cf. FIG. 4(e)). Thereafter, the plating resist was removed.

Next, an etching resist was laminated on the surfaces of the plating layer and the metal supporting board. Subsequently, the first plating lead and the front side portion of the second plating lead were removed by etching using an aqueous ferric chloride solution (cf. FIG. 4(f)).

Thereafter, the metal supporting board was washed with water and the etching resist was then removed.

In the step of etching the first plating lead and the front side portion of the second plating lead, an eroded surface which was positioned shifted rearward from the front end surface of the insulating cover layer was formed in the wide opening (cf. FIGS. 3 and 4(f')).

Thereafter, the metal supporting board was cut out to form support openings, thereby obtaining a sheet having a plurality of wired circuit boards formed thereon (cf. FIG. 1).

Comparative Example 1

Figure 19:
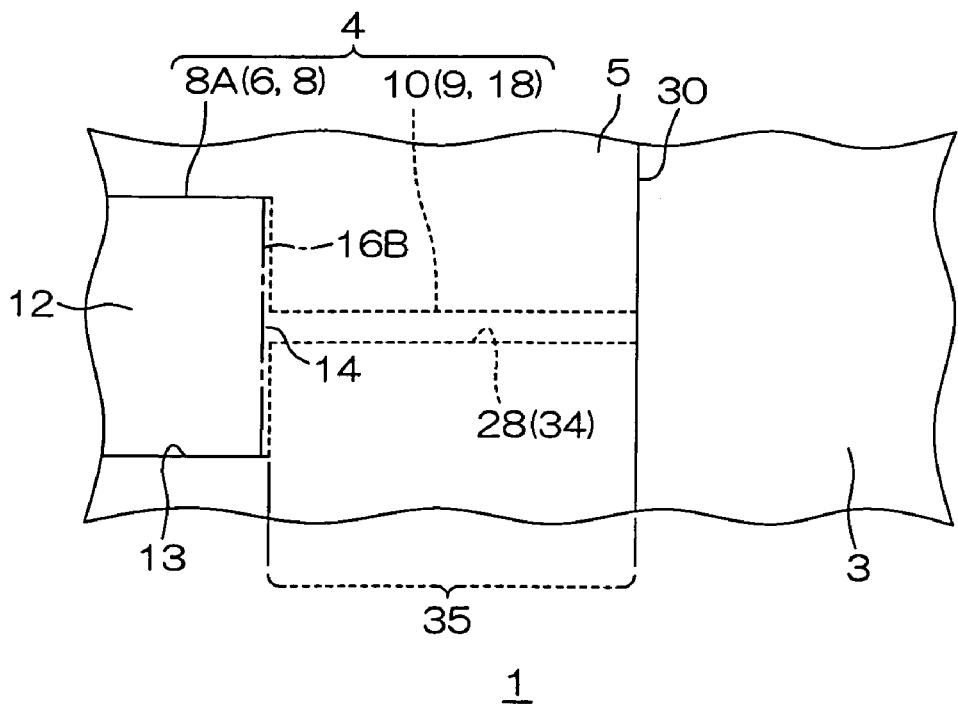
FIG. 19 shows an enlarged plan view of the second plating lead of the wired circuit board in Comparative Example 1.

The same procedures as in Example 1 were performed except that the rear side portion (35) of the first plating lead (17) was formed only from the narrow portion (10), to thereby obtain a sheet (21) having a plurality of wired circuit boards (1) thereon (cf. FIG. 19).

In the step of etching the first plating lead (17) and the front side portion (36) of the second plating lead (18), the narrow portion (10) and the front end portion of the external terminal (8A) were dissolved.

(Evaluation)

1) Presence or Absence of Discoloration of External Terminals

In the wired circuit board on the sheet in each of Example 1 and Comparative Example 1, whether the external terminal was discolored or not was observed.

The result confirmed that the external terminal in Example 1 was not discolored.

On the other hand, the result confirmed that the external terminal in Comparative Example 1 was discolored.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A method of producing a wired circuit board comprising the steps of:
   integrally forming a conductive pattern, a plating lead electrically connected with the conductive pattern and operative to feed electric power to the conductive pattern during a plating step of plating an exposed portion of the conductive pattern, and a regulation portion provided in the plating lead to regulate penetration of an etchant into the conductive pattern; and
   etching the plating lead with the etchant while the regulation portion regulates the penetration of the etchant into the conductive pattern.

2. A wired circuit board comprising:
   a conductive pattern; and
   a plating lead electrically connected with the conductive pattern and operative to feed electric power to the conductive pattern during plating of an exposed portion of the conductive pattern,
   wherein the plating lead comprises a regulation portion for regulating penetration of an etchant into the conductive pattern.

3. The wired circuit board according to claim 2, wherein the plating lead has a narrow portion having a short length in a widthwise direction orthogonal to an opposite direction to the conductive pattern, and
   a wide portion having a length in the widthwise length longer than the narrow portion,
   wherein at least the wide portion serves as the regulation portion.

4. The wired circuit board according to claim 2, wherein the plating lead has a bending portion formed so as to bend in a direction of crossing the opposite direction to the conductive pattern,
   wherein at least the bending portion serves as the regulation portion.

5. A wired circuit board comprising:
   a conductive pattern;
   a plating lead electrically connected with the conductive pattern and operative to feed electric power to the conductive pattern during plating of an exposed portion of the conductive pattern, wherein the plating lead comprises a regulation portion for regulating penetration of an etchant into the conductive pattern; and
   a covering portion for covering the regulation portion for regulating penetration of an etchant into the conductive pattern.

6. The wired circuit board according to claim 5, wherein
   a narrow opening having a short length in a widthwise direction orthogonal to the opposite direction to the conductive pattern and
   a wide opening having a length in the widthwise direction longer than the narrow opening are formed, in the covering portion,
   wherein at least the wide opening receives the regulation portion.

7. The wired circuit board according to claim 5, wherein
   a bending opening formed so as to bend in a direction of crossing the opposite direction to the conductive pattern is formed, in the covering portion,
   wherein at least the bending opening receives the regulation portion.

* * * * *